(12) United States Patent
Phoa et al.

(10) Patent No.: US 10,158,034 B2
(45) Date of Patent: Dec. 18, 2018

(54) THROUGH SILICON VIA BASED PHOTOVOLTAIC CELL

(71) Applicant: Intel Corporation, Santa Clara, CA (US)

(72) Inventors: Kinyip Phoa, Beaverton, OR (US); Nidhi Nidhi, Hillsboro, OR (US); Chia-Hong Jan, Portland, OR (US); Walid M. Hafez, Portland, OR (US); Yi Wei Chen, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/127,207

(22) PCT Filed: Jun. 27, 2014

(86) PCT No.: PCT/US2014/044550
§ 371 (c)(1),
(2) Date: Sep. 19, 2016

(87) PCT Pub. No.: WO2015/199717
PCT Pub. Date: Dec. 30, 2015

(65) Prior Publication Data
US 2017/0155004 A1    Jun. 1, 2017

(51) Int. Cl.
*H01L 31/044* (2014.01)
*H01L 31/0224* (2006.01)
(Continued)

(52) U.S. Cl.
CPC .... *H01L 31/022458* (2013.01); *H01L 31/028* (2013.01); *H01L 31/022475* (2013.01);
(Continued)

(58) Field of Classification Search
CPC ........ H01L 31/00–31/078; Y02E 10/50–10/60
(Continued)

(56) References Cited

U.S. PATENT DOCUMENTS 4,110,122 A    8/1978    Kaplow et al.
4,179,318 A    12/1979    Kaplow et al.
(Continued)

FOREIGN PATENT DOCUMENTS

CN    102214723 A    10/2011
CN    202662651 U    1/2013
(Continued)

OTHER PUBLICATIONS

International Searching Authority, "Notification of Transmittal of the International Search Report of the International Searching Authority," dated Mar. 25, 2015, in International application No. PCT/US2014/044550.
(Continued)

*Primary Examiner* — Bach T Dinh
(74) *Attorney, Agent, or Firm* — Trop, Pruner & Hu, P.C.

(57) ABSTRACT

An embodiment includes an apparatus comprising: a first photovoltaic cell; a first through silicon via (TSV) included in the first photovoltaic cell and passing through at least a portion of a doped silicon substrate, the first TSV comprising (a)(i) a first sidewall, which is doped oppositely to the doped silicon substrate, and (a)(ii) a first contact substantially filling the first TSV; and a second TSV included in the first photovoltaic cell and passing through at least another portion of the doped silicon substrate, the second TSV comprising (b)(i) a second sidewall, which comprises the doped silicon substrate, and (b)(ii) a second contact substantially filling the second TSV; wherein the first and second contacts each include a conductive material that is substantially transparent. Other embodiments are described herein.

21 Claims, 5 Drawing Sheets

(51) Int. Cl.
*H01L 31/056* (2014.01)
*H01L 31/047* (2014.01)
*H02S 40/38* (2014.01)
*H01L 31/028* (2006.01)
*H01L 31/05* (2014.01)
*H01L 31/068* (2012.01)
*H01L 31/18* (2006.01)

(52) U.S. Cl.
CPC .......... *H01L 31/047* (2014.12); *H01L 31/056* (2014.12); *H01L 31/0516* (2013.01); *H01L 31/068* (2013.01); *H01L 31/0682* (2013.01); *H01L 31/1884* (2013.01); *H02S 40/38* (2014.12); *Y02E 10/52* (2013.01); *Y02E 10/547* (2013.01)

(58) Field of Classification Search
USPC .................................. 136/243–265
See application file for complete search history.

(56) References Cited

U.S. PATENT DOCUMENTS

| | | | |
|---|---|---|---|
| 8,294,858 | B2 | 10/2012 | Limketkai et al. |
| 8,829,336 | B2 * | 9/2014 | Raffaelle ................ B82Y 20/00 136/249 |
| 2006/0097313 | A1 | 5/2006 | Yanagisawa et al. |
| 2008/0011349 | A1 | 1/2008 | Raffaele et al. |
| 2008/0017236 | A1 | 1/2008 | Perlo et al. |
| 2009/0050204 | A1 | 2/2009 | Habib |
| 2010/0218818 | A1 | 9/2010 | Kang et al. |
| 2012/0126298 | A1 | 5/2012 | Chen et al. |
| 2012/0168613 | A1 | 7/2012 | Yu et al. |
| 2013/0009851 | A1 * | 1/2013 | Danesh .................... H01G 9/20 343/904 |
| 2013/0237000 | A1 * | 9/2013 | Tabe ....................... H01L 31/18 438/57 |
| 2013/0240853 | A1 * | 9/2013 | Cao ........................ H01L 51/442 257/40 |
| 2015/0068591 | A1 * | 3/2015 | Chan ............... H01L 31/022441 136/256 |

FOREIGN PATENT DOCUMENTS

| | | |
|---|---|---|
| JP | 2008270743 A | 11/2008 |
| KR | 20110011053 A | 2/2011 |
| KR | 20110075633 A | 7/2011 |
| WO | 2013054396 A1 | 4/2013 |

OTHER PUBLICATIONS

Arima, et al., "On-Chip Solar Battery Structure For CMOS LSI", Center for Microelectronic System, Kyushu Institute of Technology, 680-4, Kawazu, Iizuka, Fukuoka 820-8502, Japan, Jul. 10, 2006, IEICE Electronics Express, vol. 3, No. 13, 287-291, 6 pages.

Horiguchi, "Integration of Series-Connected On-Chip Solar Battery in a Triple-Well CMOS LSI", IEEE Transactions On Electron Devices, Jun. 2012, 5 pages, vol. 59, No. 6.

European Patent Office, Extended European Search Report dated Jan. 4, 2018 for European Application No. 14896213.7, seven pages.

State Intellectual Property Office, Office Action dated Jan. 3, 2018, in Chinese Patent Application No. 201480079169.9, five pages.

Japanese Patent Office, Notice of Allowance dated Feb. 16, 2018, in Japanese Patent Application No. 2016-268419.

* cited by examiner

THROUGH SILICON VIA BASED PHOTOVOLTAIC CELL

TECHNICAL FIELD

Embodiments of the invention are in the field of semiconductor devices and, in particular, photovoltaic cells.

BACKGROUND

A system on a chip or system on chip (SOC) is an integrated circuit (IC) that integrates components of a computer or other electronic system into a single chip. The SOC may contain digital, analog, mixed-signal, and/or radio-frequency functions—all on a single chip substrate. A SOC may be self-powered using systems that convert vibrations, differences in temperature, or light into power. For example, a photovoltaic cell, located on the SOC, may power the SOC. A photovoltaic cell is an electrical device that converts light energy into electricity using the photovoltaic effect. The cell's current, voltage, and resistance varies when light is incident upon the cell. When exposed to light the cell can generate an electric current without being attached to any external voltage source. The light may be visible or invisible (e.g., infrared light). While conventional SOCs may include a photovoltaic cell, the current generated (and hence the power generated) by conventional silicon solar batteries (that store energy from photovoltaic cells) can be quite low (e.g., 1 mWh) depending on the illumination level. Such a low amount of current/power may be insufficient for many circuits on the SOC (e.g., a conventional (complementary metal-oxide-semiconductor) (CMOS) circuit). Such conventional systems may therefore need additional batteries (e.g., Li ion battery) to power circuits on the SOC.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1:
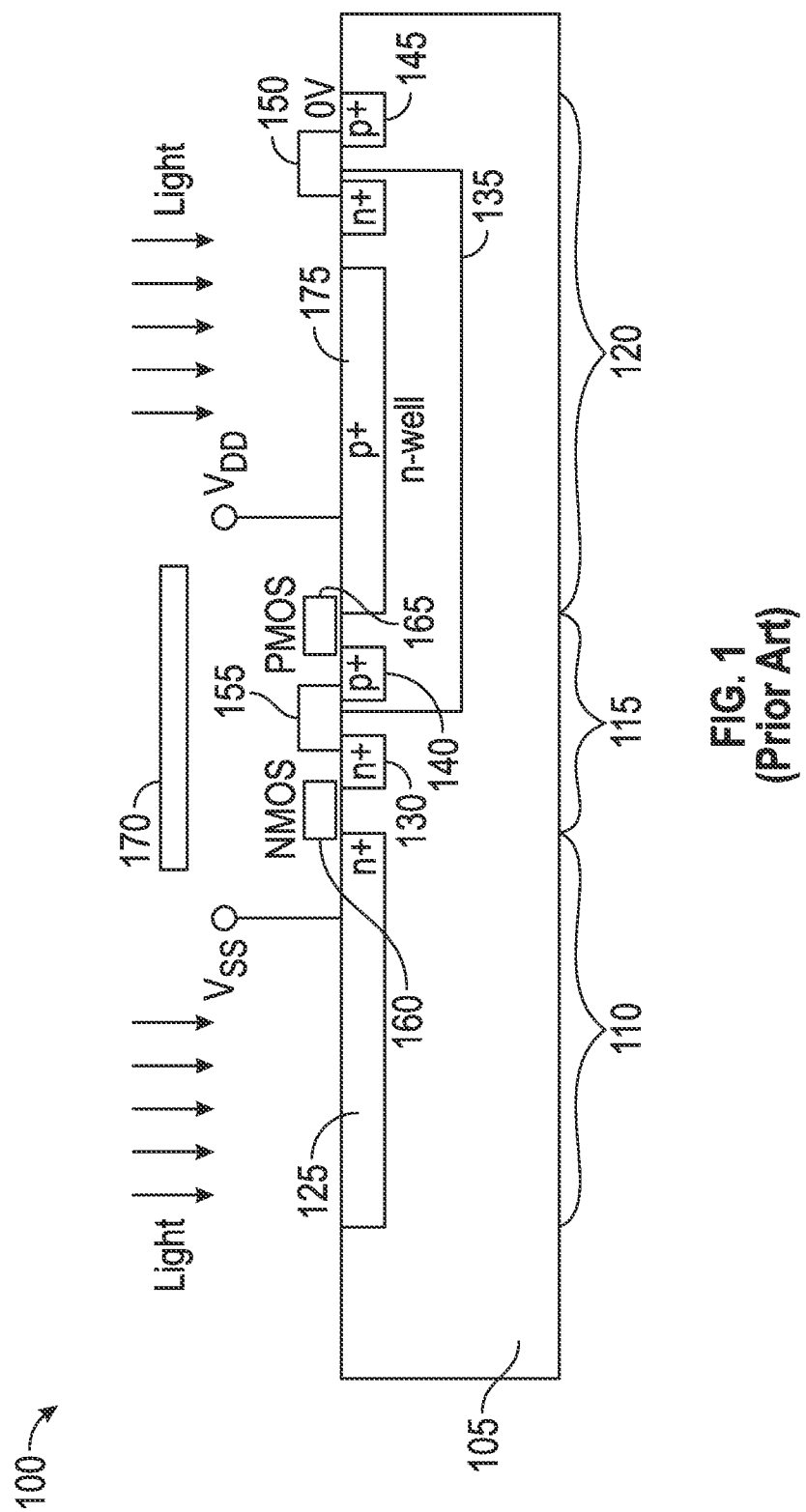
FIG. 1 includes a conventional photovoltaic cell in the form of an on-chip solar battery formed by a single-well CMOS process.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As mentioned above, some SOCs include photovoltaic cells. An example of such a photovoltaic cell is addressed in "Integration of series-connected on-chip solar battery in a triple-well CMOS LSI", Horiguchi, F., IEEE Transactions on Electron Devices, Vol. 59, No. 6 (2012): 1580-1584. For example, FIG. 1 includes a conventional photovoltaic cell in the form of an on-chip solar battery formed by a single-well CMOS process. The device 100 includes an on-chip solar battery that includes a PN junction photodiode 120 consisting of an n-well 135 and a p+ source/drain 175 and a photodiode 110 consisting of a p-substrate 105 and an n+ source/drain 125. These photodiodes are connected in series using NMOSFET 160, PMOSFET 165, short-circuit elements 150, 155, n-well node 130, and p-substrate nodes 140, 145. A positive photoinduced voltage is applied to VDD and a negative voltage is applied to VSS to form the solar battery. Portions of the device, such as components of the CMOS circuit 115, may be covered with a shading metal layer 170 to avoid unnecessary photocurrent in the CMOS circuit. The current generated (and hence the power generated) by the planar photovoltaic cell of FIG. 1 can be quite low.

In contrast, an embodiment improves the maximum current and power density that may be generated by an on-chip photovoltaic cell by increasing the PN junction area using a through-silicon-via (TSV)—a via formed (e.g., etched) through a substrate wafer (e.g., silicon substrate). This enables more efficient on-chip solar energy harvesting to supply power to the SOC or recharge a battery (on or off the same SOC as the photovoltaic cell but nevertheless coupled to the cell) during standby (resulting in enhanced battery life). For example, after the TSV is formed, a shallow angled implant of N-type (or P-type dopant) is applied to a P-type (or N-type) substrate to form a PN junction along the sidewalls of the TSV for photo-current generation. The TSV is then filled with transparent conductive material and the transparent conductive material becomes the anode (or cathode) for a photovoltaic cell. An additional TSV may lack the doped sidewall instead relying on the P-type (or N-type) substrate for its sidewall. The additional TSV is then filled with transparent conductive material and the transparent conductive material becomes the opposite node (anode or cathode) to that of the TSV with the doped sidewall, thus forming a photovoltaic cell having an anode and a cathode.

Thus, FIG. 1 shows how conventionally the PN junctions for photovoltaic cells are formed by the P+/NWELL, N+/PWELL and the NWELL/PWELL junctions on the transistor side (device layer of the front end) of silicon wafers. As a result, the PN junction area at best equals the area of the silicon dedicated for the photovoltaic cell (e.g., the areas of FIG. 1 including areas 125, 175 that are not shielded by metal 170). However, with an embodiment the PN junction is formed along the sidewall of TSV trenches. The effective area of the PN junction per TSV (i.e., the product of the circumference of a TSV trench and the thickness of the silicon wafer) can be made larger than the area occupied by planar cells or a pair of TSVs (a significant advantage over conventional systems where the PN junction area at best equals the area of the silicon dedicated for the photovoltaic cell). As a result, the photo-current generated per area (power generated per area) is enhanced compared to planar cells. A more detailed description of this embodiment and other embodiments now follows.

Figure 2:
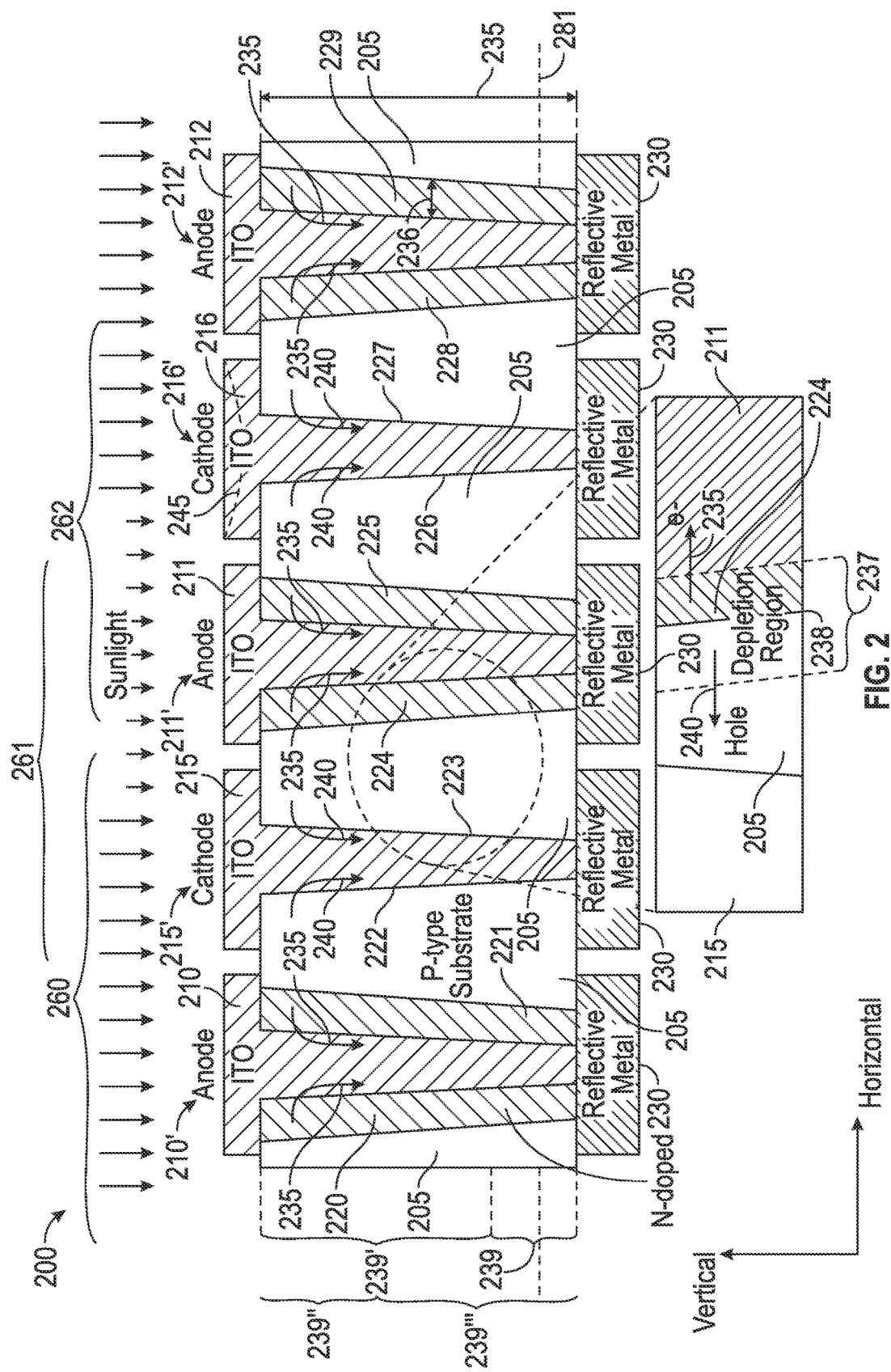
FIG. 2 depicts a plurality of TSV based photovoltaic cells in an embodiment of the invention.

FIG. 2 depicts a plurality of TSV based photovoltaic cells in an embodiment of the invention. Apparatus 200 comprises a first TSV 210' passing through at least a portion of a doped silicon substrate 205. In this embodiment the substrate is a P-type doped substrate. The first TSV 210' comprises sidewalls 220, 221 which are doped oppositely to the doped silicon substrate. Thus, the substrate 205 is P-typed doped and the sidewalls 220, 221 are N-type doped. The TSV 210' includes a first contact 210 substantially filling the TSV 210' (where the via is the aperture traversing the substrate and the contact is the metal filling of the aperture). FIG. 2 also includes a second TSV 215' that passes through at least another portion of the doped silicon substrate 205. The TSV 215' comprises sidewalls 222, 223 which comprise the doped silicon substrate 205 (but are not doped like sidewalls 220, 221). TSV 215' also includes contact 215 substantially filling the TSV 215'. Contacts 210, 215 each include a conductive material that is substantially transparent, such as Iridium Tin Oxide (ITO). Contact 210 forms an anode and contact 215 forms a cathode which collectively help to form photovoltaic cell 260.

In an embodiment a bottom of the contact 210 couples (directly or indirectly) to a reflective metal portion 230 and a bottom of the contact 215 couples (directly or indirectly) to a reflective metal portion 230. In an embodiment the reflective metal portions 230 include at least one of copper and aluminum, however other embodiments are not so limited. Reflective metal portions 230 directly contact a bottom surface of the doped silicon substrate 205 in an embodiment.

FIG. 2 also includes a second photovoltaic cell 261. More specifically, apparatus 200 includes additional TSV 211', which passes through at least a portion of the doped silicon substrate 205. The additional TSV 211' comprises additional sidewalls 224, 225, which are doped oppositely to the doped silicon substrate. Thus, for the example of FIG. 2 the sidewalls 224, 225 are N-type doped portions in contrast to P-type substrate 205. TSV 211' includes an additional contact 211 substantially filling the TSV 211'. Also, TSV 215' is included in both the first photovoltaic cell 260 (which includes TSVs 210' and 215') and the second photovoltaic cell 261 (which includes TSVs 215' and 211'). Further, the additional contact 211 includes a transparent and conductive material such as ITO.

FIG. 2 also includes a third photovoltaic cell 262 (which includes TSVs 211' and 216'). Specifically, apparatus 200 includes an additional TSV 216' included in the third photovoltaic cell 262 and passing through at least another portion of the doped silicon substrate 205. The additional TSV 216' comprises additional sidewalls 226, 227, which comprise the doped silicon substrate (but are not doped like sidewalls 220, 221). TSV 216' also includes an additional contact 216 substantially filling the additional TSV 216'.

TSV 211' may be included in both photovoltaic cell 261 and photovoltaic cell 262. Contact 216 includes a transparent and conductive material such as ITO.

In FIG. 2 doped sidewall 224 (taken as a representative example of numerous doped sidewalls) contacts the doped silicon substrate 205 at an interface 238 (graded or non-graded interface) that forms a PN junction and depletion region 237. The PN junction extends from a top of the sidewall 224 to a bottom of the sidewall 224 and the sidewall 224 extends from a top of the doped silicon substrate 205 to a bottom of the doped silicon substrate 205. In an embodiment, the PN junction is at least 50 µm long (see unit 235) in the vertical direction. However, other embodiments are 40 µm, 75 µm, 100 µm, 125 µm, 150 µm, 175 µm, 200 µm long, or more. In an embodiment the width 236 of an n-doped (or a p-doped region) region can range from 10 nm (i.e., a very sharp junction) to 1,000 nm (i.e., a graded junction) including widths of 50 nm, 100 nm, 200 nm, 300 nm, 400 nm, 500 nm, 600 nm, 700 nm, 800 nm, and 900 nm.

Regarding function of apparatus 200, electrodes 211 and 215 are representative of electrodes that may form a cell, such as cell 261. Anode electrode 211 couples to N-type donor layer 224 and cathode electrode 215 couples to P-type acceptor layer 205. The energy levels of the donor and acceptor layers are designed in such a way that there is an energy gradient for the electrons (e−) to move (see current 235) to the anode electrode 211. In other words, the donor layer 224 (also referred to as the doped sidewall) "donates" electrons and the acceptor layer 205 (also referred to as the P-type substrate) 205 "accepts" electrons (acceptor accepts electrons donated from donor). More specifically, the cell absorbs photons (see "sunlight" of FIG. 2) when light shines on the depletion region 237 of the PN junction. This generates electron-hole pairs, which subsequently diffuse and become disassociated (see elements 240, 235 of FIG. 2) at the donor-acceptor interface 238. The electron-hole pairs split apart and the electrons move to the anode electrode 211 and the holes move to the cathode electrode 215, thus generating a photocurrent for the photovoltaic cell.

In an embodiment the PN junction extends deeper into a substrate than a device layer formed at a surface portion of the doped silicon substrate 205. For example, portion 239 of substrate 205 may constitute a front end of the SOC wherein in other locations on the SOC transistors and other devices may be formed. As shown in FIG. 2, the PN junction clearly extends "above" the device layer of layer 239 (not shown because located elsewhere on the SOC) and into and through the remainder of the substrate 239'. For example, photovoltaic cells 260, 261, 262 are included on a SOC and electrically couple to at least one of a battery and a transistor located elsewhere on the SOC (where the battery and/or transistor are located outside the cells 260, 261, 262 but on the SOC). Also, embodiments are not limited as to orientation with regard to a device layer. For example, in an embodiment the device layer is included at 239" and the TSV 210 extends through the remainder of the substrate 239'''.

In an embodiment a bottom portion of the contact 210 is narrower than a top portion of the contact (see FIG. 2). This may help capture the largest amount of light into the TSV, which will then be applied to the PN junction (i.e., slanting the sidewalls this way may provide a larger area to absorb the light transmitted from the top surface of the contact). However, in other embodiments a bottom portion of the contact 210 is broader than a top portion of the contact. To function, note the top of the contacts 210, 211, 212, 215, 216 are uncovered and configured to pass light into their respective TSVs.

In an embodiment a top surface of the first contact is flat and generally parallel to a long axis 281 (which is horizontally oriented) of the substrate 205. For example, the tops of contacts 210, 215 in FIG. 2 are flat. This may require a planarization step to remove any domed component for the tops of the contacts that may exist due to normal contact formation techniques. However, other embodiments may include a contact top surface that is concave (see dashed line 245) with a middle portion of the top surface closer to the reflective metal 230 than outer portions of the top surface of the contact. This may better distribute light to the sidewalls where PN junctions are located.

For brevity, TSV 212', contact 212, and sidewalls 228, 229 are not discussed herein as TSV 210' is representative of TSV 212'.

Figure 3A:
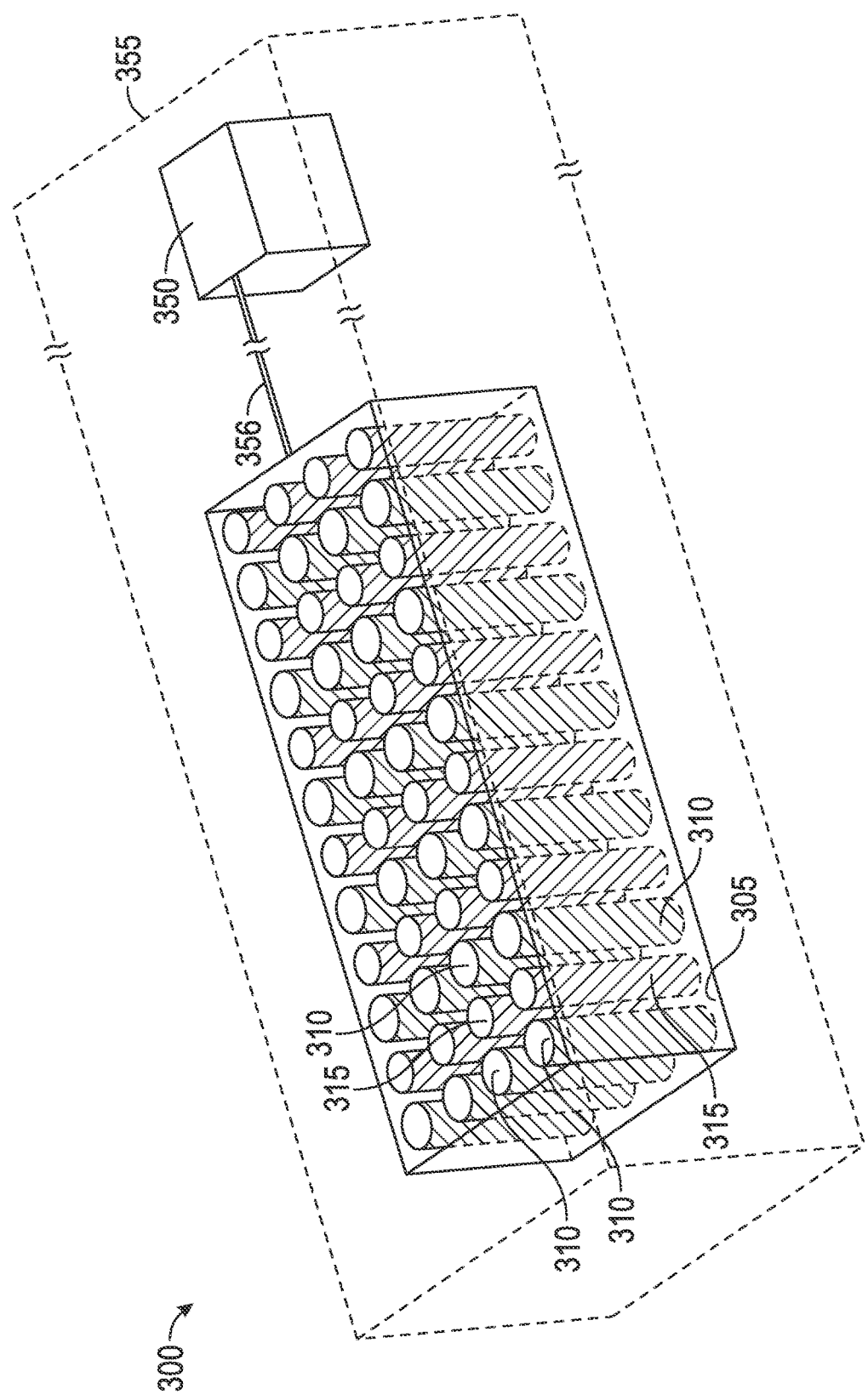
FIG. 3a includes a plurality of TSV based photovoltaic cells (arranged in a linear pattern) in a SOC in an embodiment of the invention.
Figure 3B:
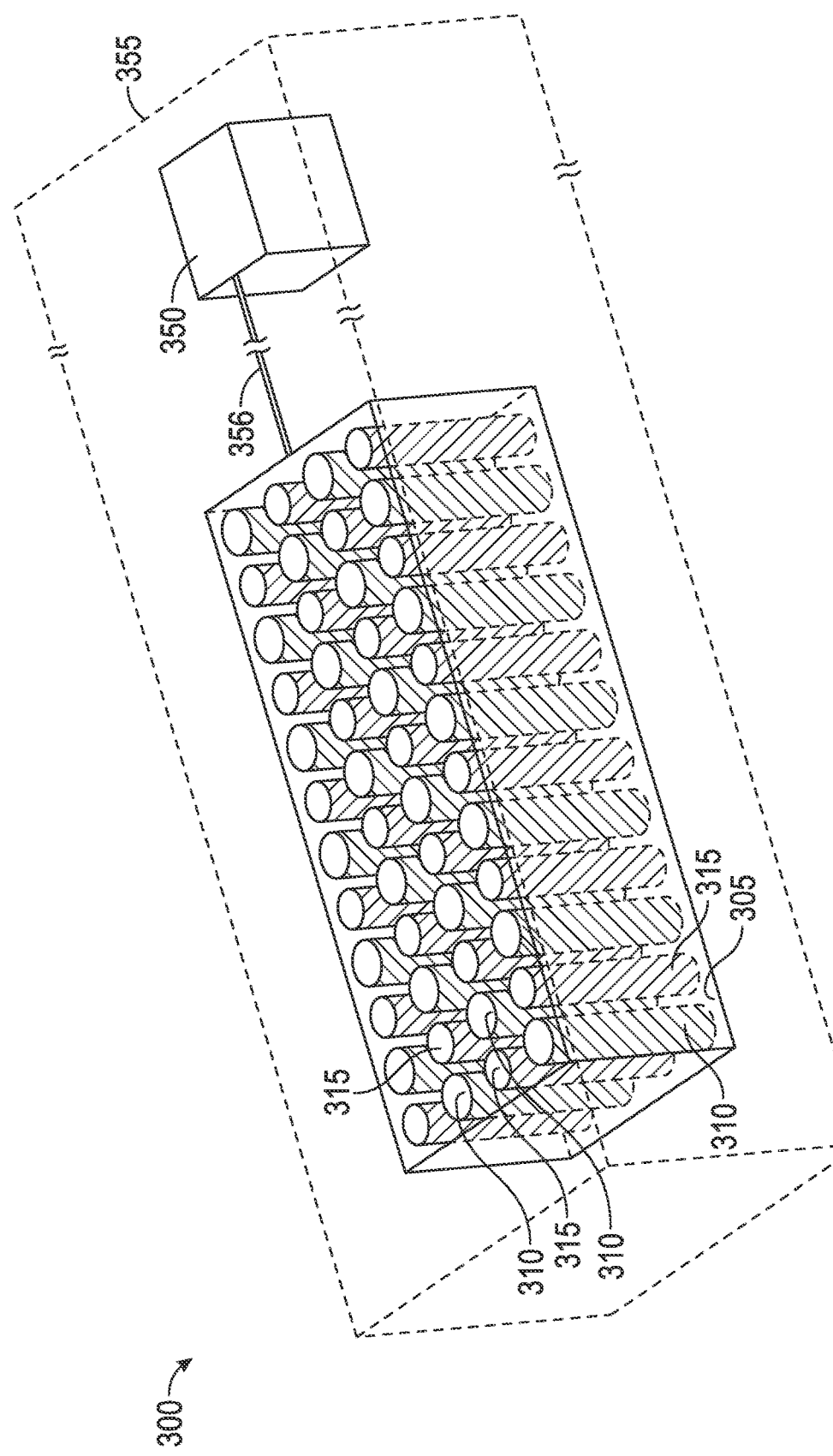
FIG. 3b includes a plurality of TSV based photovoltaic cells (arranged in an alternating pattern) in a SOC in an embodiment of the invention.

FIG. 3a includes a plurality of TSV based photovoltaic cells (arranged in a linear pattern) in a SOC in an embodiment of the invention. For example, cathodes 315 are arranged in rows that alternate with anodes 310, all located within substrate 305. The array of cells 300 is coupled (e.g., trace 356) to a component (e.g., oscillator, processor, battery, transistor(s)) 350 located elsewhere on the SOC 355 (or the cell may be located on a chip/wafer and the component 350 may be located on another chip/wafer). FIG. 3b includes a plurality of TSV based photovoltaic cells (arranged in an alternating pattern) in a SOC in an embodiment of the invention. For example, rows of electrodes include alternating cathodes 315 and anodes 310, all within substrate 305. The array of cells 300 is coupled (e.g., trace 356) to a component (e.g., oscillator, processor, battery, transistor(s)) 350 located elsewhere on the SOC 355. The arrays of cells may power component 350 if component 350 is, for example, an oscillator or clock circuit, etc. or may charge component 350 if the component is a battery or other energy storage device.

Figure 4:
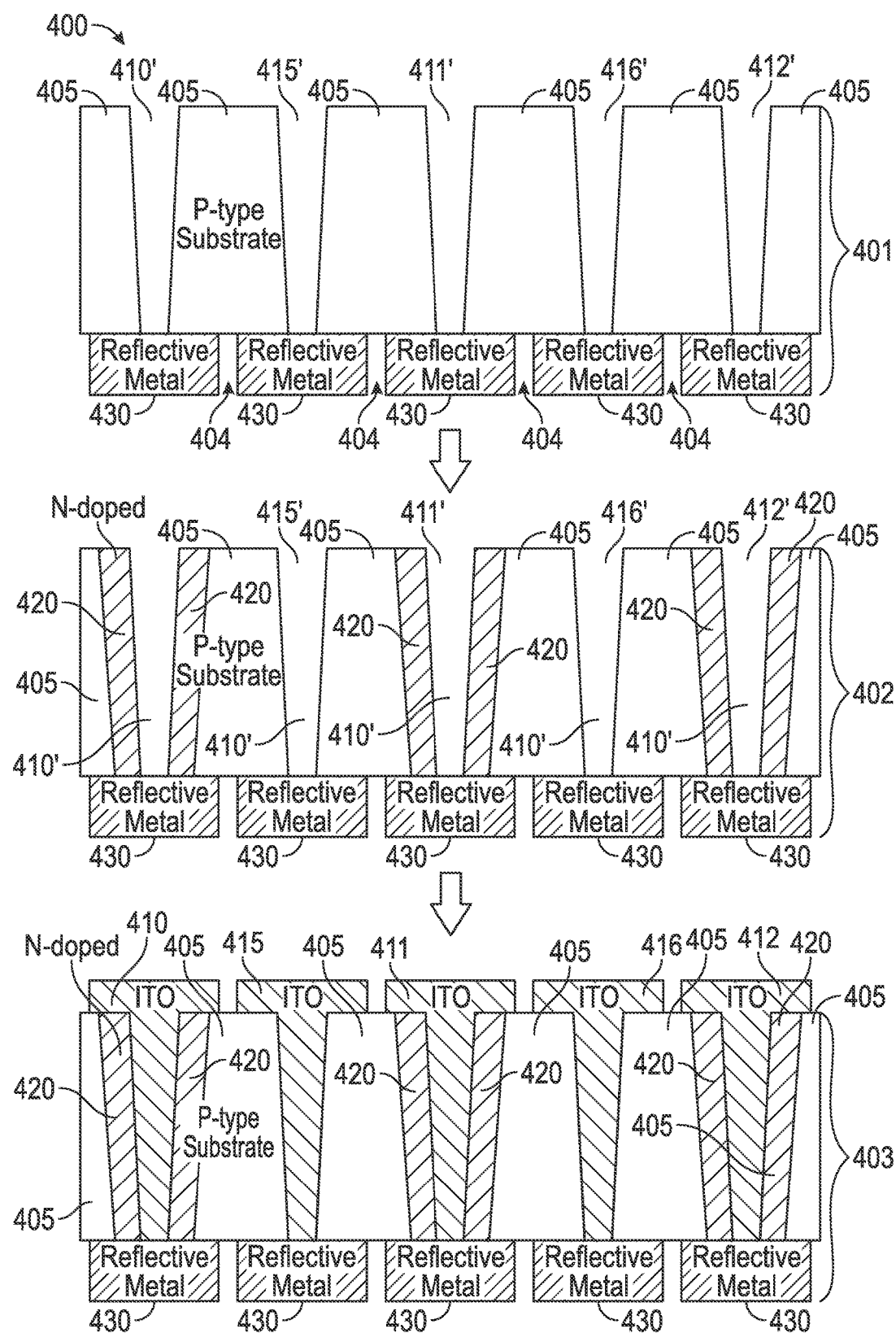
FIG. 4 includes a method in an embodiment of the invention.

FIG. 4 includes a method in an embodiment of the invention.

Method 400 includes forming a reflective metal 430 in direct contact with a bottom surface of a doped substrate 405 (see bracket 401) and patterning the reflective metal into portions not contacting each other (see gaps 404). Method 400 also includes forming vias 410', 415', 411', 416', 412', included in a plurality of photovoltaic cells. The vias each extend from a top surface of the doped substrate 405 to a bottom surface of the doped substrate 405 (see bracket 401). In an embodiment the substrate 405 is thinned to roughly 50 µm to 100 µm, which is the absorption thickness of visible light spectrum. Therefore even the PN junction farthest away from the incident light surface (i.e., the PN junction portions located nearest the bottom of TSVs, such as the narrower portion of the TSV 210 of FIG. 2) contribute to photo-current generation.

Bracket 402 concerns doping sidewalls 420 of vias 410', 411', 412' in a manner oppositely doped to the doped substrate 405. Thus, in FIG. 4 the substrate is a P-type substrate and the doped sidewalls are N-type. Doping can be done by, for example, solid state diffusion, gas-phase diffusion, and the like to form the PN junction along the trench/via sidewall.

Bracket 403 includes forming contacts 410, 415, 411, 416, 412 that substantially fill vias 410', 415', 411', 416', 412'. The contacts also couple to reflective metal 430. The contacts each include a conductive material that is substantially transparent (e.g., ITO).

With transparent metal on the top side of the contacts, light (e.g., sunlight) shines into the TSV and encounters the PN junction to generate photocurrent. The reflective metal deposited on the backside of the substrate wafer allows any light that penetrates to the bottom of the TSV to be reflected upwards back towards the PN junction on the sidewalls of the TSV. In some embodiments a metal layer stack is formed on the reflective metal layer. However, in some embodiments the metal layer stack may be absent or at least absent in some locations so light may enter the TSV from the top of the TSV and from the bottom of the TSV (i.e., there may be no reflective metal in some embodiments if light is allowed to enter the TSV from multiple openings into the TSV). In such an embodiment the TSV may have various forms and may be tapered at its top, bottom (as seen in FIG. 2), or at some point in between (e.g., hourglass shape). Also, vias that are not TSVs are included in some embodiments. In other words, a deep via (e.g., extending fully or partially through a non-silicon substrate) may still include doped sidewalls and the like to form photovoltaic cells as mentioned above.

An embodiment including a vertical photovoltaic cell provides critical advantages over conventional planar photovoltaic cells. For example, an embodiment may produce 50× more power per area than planar cells (e.g., 50 mWh or more) and, as a result, may require less or no additional power from a battery (e.g., Li ion battery) to operate circuits on, for example, a SOC. Even if an auxiliary battery is needed the embodiment can draw less power from the battery and, consequently, increase the time before the battery needs recharging. The on-chip photovoltaic cell may supplement the normal battery to power a processor, graphics component, memory, and other power consuming parts. The on-chip photovoltaic cell may charge a battery.

An embodiment including a vertical or fin-based photovoltaic cell provides critical advantages over conventional planar photovoltaic cells for yet more reasons. For example, with a minimum pitch of 10 µm a planar cell may have an area of about 200 µm$^2$. However, this 200 µm$^2$ cannot all be dedicated to light capture as contacts and the like must interface the cell, so 200 µm$^2$ may be the maximum area for light absorption. With a depletion region depth of about 0.1 µm the total volume for the planar cell is about 20 µm$^3$.

However, in an embodiment of the invention TSV pitch may be about 10 µm, with a TSV radius less than 10 µm. For example, the diameter may be about 9 µm. This results in a circumference of about 30 µm. With a TSV depth of 200 µm this yields an area of (30×200)=6,000 µm$^2$. With the same doping concentration as used in the planar cell example and the same depth of depletion region, this yields a total volume of 10,000 µm$^2$×0.1 µm=600 µm$^3$ (an overall enhancement of 30 times the volume of the planar cell).

The above example uses exemplary values (e.g., a planar cell may have an area of about 200 µm$^2$) and those values may change in planar cells that have larger surface areas of cells exposed to light. However, the point remains that a TSV including the same surface area on a top surface of a substrate will provide more PN exposure due to the depth of the TSV (e.g., the overall enhancement of, for example, 30 times the volume of the planar cell will remain). If the depth of the TSV increases, the enhancement will be even higher than 30 times.

The substrate at times herein is referred to as including silicon and being P-type doped. However, other embodiments include N-type doped substrates. Furthermore, other embodiments may include, without limitation, substrates having III-V materials like GaAs, GaN, and the like. The substrate may include wide bandgap materials for the high energy spectrum such as, for example and without limitation, SiC and the like. Other embodiments may include narrow bandgap materials for low energy spectrum (e.g., Ge). Also, different embodiments may use different dopants such as, for example and without limitation, Boron, Gallium or Indium for P-type doping and Phosphorus, Arsenic, Antimony, or Nitrogen for N-type doping.

Various embodiments include a semiconductive substrate. Such a substrate may be a bulk semiconductive material that is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes An apparatus comprising: a first photovoltaic cell; a first through silicon via (TSV) included in the first photovoltaic cell and passing through at least a portion of a doped silicon substrate, the first TSV comprising (a)(i) a first sidewall, which is doped oppositely to the doped silicon substrate, and (a)(ii) a first contact substantially filling the first TSV; and a second TSV included in the first photovoltaic cell and passing through at least another portion of the doped silicon substrate, the second TSV comprising (b)(i) a second sidewall, which comprises the doped silicon substrate, and (b)(ii) a second contact substantially filling the second TSV; wherein the first and second contacts each include a conductive material that is substantially transparent.

In example 2 the subject matter of the Example 1 can optionally include wherein a first bottom surface of the first contact couples to a first reflective metal portion and a second bottom surface of the second contact couples to a second reflective metal portion, the first and second reflective metal portions configured to reflect light into the first and second TSVs.

In example 3 the subject matter of the Examples 1-2 can optionally include wherein the first reflective metal portion includes at least one of copper and aluminum.

In example 4 the subject matter of the Examples 1-3 can optionally include wherein the first reflective metal portion directly contacts a bottom surface of the doped silicon substrate.

In example 5 the subject matter of the Examples 1-4 can optionally include wherein the first contact is an anode, the second contact is a cathode, the doped silicon substrate is p doped, and the first sidewall is n doped.

In example 6 the subject matter of the Examples 1-5 can optionally include wherein a first bottom portion of the first contact is narrower than a first top portion of the first contact.

In example 7 the subject matter of the Examples 1-6 can optionally include a second photovoltaic cell; an additional TSV included in the second photovoltaic cell and passing through at least a portion of the doped silicon substrate, the additional TSV comprising (c)(i) an additional sidewall, which is doped oppositely to the doped silicon substrate, and (c)(ii) an additional contact substantially filling the additional TSV; and the second TSV included in both the first and second photovoltaic cells; wherein the additional contact includes the conductive material.

In example 8 the subject matter of the Examples 1-7 can optionally include a second photovoltaic cell; an additional TSV included in the second photovoltaic cell and passing through at least another portion of the doped silicon substrate, the additional TSV comprising (c)(i) an additional sidewall, which comprises the doped silicon substrate, and (c)(ii) an additional contact substantially filling the additional TSV; and the first TSV included in both the first and second photovoltaic cell; wherein the additional contact includes the conductive material.

In example 9 the subject matter of the Examples 1-8 can optionally include wherein the first sidewall contacts the doped silicon substrate at an interface that includes a PN junction.

In example 10 the subject matter of the Examples 1-9 can optionally include wherein the PN junction extends from a top of the first sidewall to a bottom of the first sidewall and the first sidewall extends from a top of the doped silicon substrate to a bottom of the doped silicon substrate.

In example 11 the subject matter of the Examples 1-10 can optionally include wherein the PN junction is at least 50 µm long. In an embodiment (but not all embodiments) this is a critical dimension needed to produce enough power to operate a component of a circuit or a battery.

In example 12 the subject matter of the Examples 1-11 can optionally include wherein the PN junction extends below a device layer formed at a top portion of the doped silicon substrate.

In example 13 the subject matter of the Examples 1-12 can optionally include wherein a first bottom portion of the first contact is broader than a first top portion of the first contact.

In example 14 the subject matter of the Examples 1-13 can optionally include The apparatus of claim 1, wherein the first photovoltaic cell is included on a system on a chip (SOC) and electrically couples to at least one of a battery and a transistor, the at least one of the battery and the transistor being located outside the first photovoltaic cell but on the SOC.

In example 15 the subject matter of the Examples 1-14 can optionally include wherein a top of the first contact is uncovered and configured to pass light into the TSV.

In example 16 the subject matter of the Examples 1-15 can optionally include wherein a top surface of the first contact is selected from the group comprising: (a) concave with a middle portion of the top surface closer to a bottom surface of the doped silicon substrate than outer portions of the top surface, and (b) flat and generally parallel to a long axis of the substrate.

Example 17 includes an apparatus comprising: a first via, included in a first photovoltaic cell and extending from a top surface of a doped substrate to a bottom surface of the doped substrate, comprising (a)(i) a first sidewall oppositely doped to the doped substrate, and (a)(ii) a first contact substantially filling the first via; and a second via, included in the first photovoltaic cell and extending from the top surface to the bottom surface, comprising (b)(i) a second sidewall comprising the doped substrate, and (b)(ii) a second contact substantially filling the second via; wherein the first and second contacts each include a transparent conductive material. Again, not all embodiments require a TSV and some embodiments may use vias (e.g., that extend through non-silicon substrates) or other apertures instead of TSVs or in addition to TSVs to form photovoltaic cells.

In example 18 the subject matter of the Example 17 can optionally include wherein bottoms of the first and second contacts couple to a reflective metal that directly contacts a bottom surface of the doped substrate.

In example 19 the subject matter of the Examples 17-18 can optionally include an additional via, included in a second photovoltaic cell and extending from the top surface to the bottom surface, comprising (c)(i) an additional sidewall oppositely doped to the doped substrate, and (c)(ii) an additional contact substantially filling the additional via; and the second via included in both the first and second photovoltaic cells; wherein the additional contact includes the transparent conductive material.

In example 20 the subject matter of the Examples 17-19 can optionally include wherein the first sidewall contacts the doped substrate at an interface that includes a PN junction that extends from a top of the doped substrate to a bottom of the doped substrate.

Example 21 includes a method comprising: forming a reflective metal in direct contact with a bottom surface of a doped substrate; patterning the reflective metal into portions not contacting each other; forming first and second vias, included in a first photovoltaic cell, which each extend from a top surface of the doped substrate to a bottom surface of the doped substrate; doping a first sidewall of the first via in a manner oppositely doped to the doped substrate; and forming first and second contacts substantially filling the first and second vias and coupled to the reflective metal; wherein the first and second contacts each include a conductive material that is substantially transparent.

In example 22 the subject matter of the Example 21 can optionally include wherein the first sidewall contacts the doped substrate at an interface that includes a PN junction that extends from a top of the doped substrate to a bottom of the doped substrate.

In example 23 the subject matter of the Examples 21-22 can optionally include forming an additional via, included in a second first photovoltaic cell, which extends from the top surface to the bottom surface; doping an additional sidewall of the additional via in a manner oppositely doped to the doped substrate; and forming an additional contact substantially filling the additional via and coupled to the reflective media; wherein the second via is included in both the first and second photovoltaic cells and the additional contact includes the transparent conductive material.

In example 24 the subject matter of the Examples 21-23 can optionally include wherein the first contact is an anode, the second contact is a cathode, the doped substrate is p doped, and the first sidewall is n doped.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a first photovoltaic cell;
   a first through silicon via (TSV) included in the first photovoltaic cell and passing through at least a portion of a doped silicon substrate, the first TSV comprising (a)(i) a first sidewall, which is doped oppositely to the doped silicon substrate, and (a)(ii) a first contact substantially filling the first TSV; and
   a second TSV included in the first photovoltaic cell and passing through at least another portion of the doped silicon substrate, the second TSV comprising (b)(i) a second sidewall, which comprises the doped silicon substrate, and (b)(ii) a second contact substantially filling the second TSV;
   wherein the first and second contacts each include a conductive material that is substantially transparent;
   wherein the first sidewall contacts the doped silicon substrate at an interface that includes a PN junction;
   wherein the PN junction is at least 50 µm long.

2. The apparatus of claim 1, wherein a first bottom surface of the first contact couples to a first reflective metal portion and a second bottom surface of the second contact couples to a second reflective metal portion, the first and second reflective metal portions configured to reflect light into the first and second TSVs.

3. The apparatus of claim 2, wherein the first reflective metal portion directly contacts a bottom surface of the doped silicon substrate.

4. The apparatus of claim 2, wherein the first contact is an anode, the second contact is a cathode, the doped silicon substrate is p doped, and the first sidewall is n doped.

5. The apparatus of claim 1, wherein a first bottom portion of the first contact is narrower than a first top portion of the first contact.

6. The apparatus of claim 1, comprising:
   a second photovoltaic cell;
   an additional TSV included in the second photovoltaic cell and passing through at least a portion of the doped silicon substrate, the additional TSV comprising (c)(i) an additional sidewall, which is doped oppositely to the doped silicon substrate, and (c)(ii) an additional contact substantially filling the additional TSV; and
   wherein the second TSV is included in both the first and second photovoltaic cells;
   wherein the additional contact includes the conductive material.

7. The apparatus of claim 1, comprising:
   a second photovoltaic cell;
   an additional TSV included in the second photovoltaic cell and passing through at least another portion of the doped silicon substrate, the additional TSV comprising (c)(i) an additional sidewall, which comprises the doped silicon substrate, and (c)(ii) an additional contact substantially filling the additional TSV; and
   wherein the first TSV is included in both the first and second photovoltaic cells;
   wherein the additional contact includes the conductive material.

8. The apparatus of claim 1, wherein the PN junction extends from a top of the first sidewall to a bottom of the first sidewall and the first sidewall extends from a top of the doped silicon substrate to a bottom of the doped silicon substrate.

9. The apparatus of claim of claim 1, wherein the PN junction extends below a device layer formed at a top portion of the doped silicon substrate.

10. The apparatus of claim of claim 1, wherein a first bottom portion of the first contact is broader than a first top portion of the first contact.

11. The apparatus of claim 1, wherein the first photovoltaic cell is included on a system on a chip (SOC) and electrically couples to at least one of a battery and a transistor, the at least one of the battery and the transistor being located outside the first photovoltaic cell but on the SOC.

12. The apparatus of claim 1, wherein a top of the first contact is uncovered and configured to pass light into the TSV.

13. An apparatus comprising:
a first via, included in a first photovoltaic cell and extending from a top surface of a doped substrate to a bottom surface of the doped substrate, comprising (a)(i) a first sidewall oppositely doped to the doped substrate, and (a)(ii) a first contact substantially filling the first via; and
a second via, included in the first photovoltaic cell and extending from the top surface to the bottom surface, comprising (b)(i) a second sidewall comprising the doped substrate, and (b)(ii) a second contact substantially filling the second via;
an additional via, included in a second photovoltaic cell and extending from the top surface to the bottom surface, comprising (c)(i) an additional sidewall oppositely doped to the doped substrate, and (c)(ii) an additional contact substantially filling the additional via;
wherein (d)(i) the first and second contacts each include a transparent conductive material, (d)(ii) the second via is included in both the first and second photovoltaic cells; and (d)(iii) the additional contact includes the transparent conductive material.

14. The apparatus of claim 13, wherein bottoms of the first and second contacts couple to a reflective metal that directly contacts a bottom surface of the doped substrate.

15. The apparatus of claim 13, wherein the first sidewall contacts the doped substrate at an interface that includes a PN junction that extends from a top of the doped substrate to a bottom of the doped substrate.

16. A method comprising:
forming a reflective metal in direct contact with a bottom surface of a doped substrate;
patterning the reflective metal into portions not contacting each other;
forming first and second vias, to be included in a first photovoltaic cell, which each extend from a top surface of the doped substrate to a bottom surface of the doped substrate;
doping a first sidewall of the first via in a manner oppositely doped to the doped substrate; and
forming first and second contacts substantially filling the first and second vias and coupled to the reflective metal;
wherein the first and second contacts each include a conductive material that is substantially transparent;
wherein the first sidewall and the doped silicon substrate comprise a PN junction that is at least 50 μm long.

17. The method of claim 16, wherein the first sidewall contacts the doped substrate at an interface that includes the PN junction and the PN junction extends from a top of the doped substrate to a bottom of the doped substrate.

18. The method of claim 17, comprising:
forming an additional via, to be included in a second first photovoltaic cell, which extends from the top surface to the bottom surface;
doping an additional sidewall of the additional via in a manner oppositely doped to the doped substrate; and
forming an additional contact substantially filling the additional via and coupled to the reflective media;
wherein the second via is included in both the first and second photovoltaic cells and the additional contact includes the transparent conductive material.

19. The method of claim 17, wherein the first contact is an anode, the second contact is a cathode, the doped substrate is p doped, and the first sidewall is n doped.

20. The apparatus of claim 1, wherein the second sidewall is doped at a concentration level of dopant and the doped silicon substrate is substantially doped at the concentration level of dopant.

21. The apparatus of claim 1, wherein:
the first contact extends above the doped silicon substrate; and
the first contact does not extend below the doped silicon substrate.

* * * * *